US006835652B2

(12) United States Patent
Fujimoto (10) Patent No.: US 6,835,652 B2
(45) Date of Patent: Dec. 28, 2004

(54) METHOD OF FABRICATING PATTERNS WITH A DUAL DAMASCENE PROCESS

(75) Inventor: Masashi Fujimoto, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 65 days.

(21) Appl. No.: 10/408,317

(22) Filed: Apr. 8, 2003

(65) Prior Publication Data

US 2003/0198896 A1 Oct. 23, 2003

(30) Foreign Application Priority Data

Apr. 17, 2002 (JP) ........................................ 2002-114234

(51) Int. Cl.[7] .......................................... H01L 21/4763
(52) U.S. Cl. ....................... 438/636; 438/618; 438/628; 438/634; 438/641; 438/644
(58) Field of Search ............................... 438/618, 623, 438/627, 628, 634, 636, 637, 641, 644

(56) References Cited

U.S. PATENT DOCUMENTS 6,391,472 B1 * 5/2002 Lamb et al. ................ 428/624

FOREIGN PATENT DOCUMENTS

| JP | 2000-195955 | 7/2000 |
| JP | 2000-269326 | 9/2000 |
| JP | 2002-93901 | 3/2002 |
| JP | 2002-93904 | 3/2002 |

* cited by examiner

Primary Examiner—Amir Zarabian
Assistant Examiner—Pamela E Perkins
(74) Attorney, Agent, or Firm—Young & Thompson (57) ABSTRACT

A via hole 18 is opened in an interlayer insulating film 17, which covers a lower layer interconnect 12, a protective film 19 is embedded on the base portion of the via hole 18, and a soluble resin 20, which dissolves in a resist developing fluid under unexposed conditions, is further embedded thereupon. On this basis, a photoresist 21 is applied, and this photoresist 21 is subjected to an exposure and a development process so as to form a resist pattern 21*a*, which has an aperture window in a region including the via hole. Upon formation of an interconnective trench in the interlayer insulating film 17 utilizing the resist pattern 21*a*, a dual damascene structure is formed by embedding a metallic material into the vial hole and interconnective trench.

13 Claims, 8 Drawing Sheets

METHOD OF FABRICATING PATTERNS WITH A DUAL DAMASCENE PROCESS

BACKGROUND OF THE INVENTION

1. Field of the Invention

The present invention relates to a dual damascene process. It is particularly related to a method of fabricating a pattern of a via and an interconnective trench with a via-first method, namely by first forming the via so as to connect upper and lower layers with interconnect.

2. Description of the Prior Art

Recently, improvements in performance and function of semiconductor integrated circuits used for electronic information technology devices including mobile phones are well known. The fact that such semiconductor integrated circuit is manufactured with a high-precision semiconductor manufacturing process is also well known. In addition, attention is given to an interconnection structure manufactured with the dual damascene process within the above high-precision semiconductor manufacturing process.

Such dual damascene process is an approach to forming multi-layered interconnection by forming both an interconnective trench, which becomes an upper layer interconnect formed and embedded in an interlayer insulating film, and a via hole, which is used to connect an upper layer interconnect with a lower layer interconnect, and then embedding a metal film in the upper layer interconnect and the lower layer interconnect, simultaneously. There are advantages where semiconductor manufacturing steps may be reduced and manufacturing costs thereof may be greatly reduced in comparison to the process that individually forms a via hole and interconnective trench. Particularly, the via-first method is one dual damascene process that first forms the via hole within the interlayer insulating film, subsequently forming the interconnective trench.

Figure 1A:
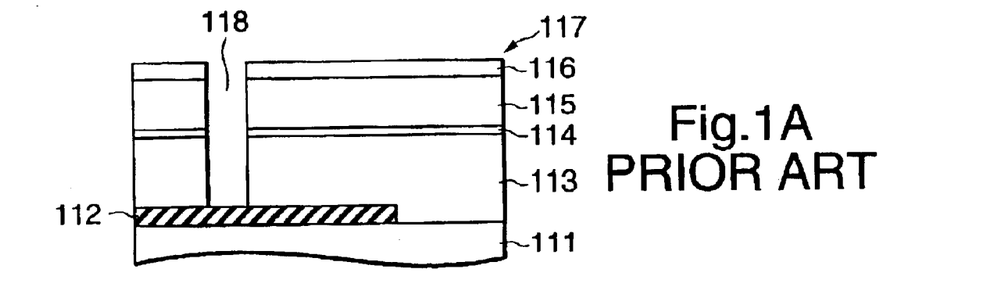
FIG. 1A through FIG. 1D depict cross-sections illustrating a conventional example of a pattern formation process in order of steps thereof.

FIG. 1A through FIG. 1D and FIG. 2A through FIG. 2C depict a conventional via-first method. To begin with, as illustrated in FIG. 1A, an interlayer insulating film 117 is formed by successively layering a silicon dioxide film 113, an etch stop film 114, a low-permittivity film 115 and a silicon dioxide film 116 upon a lower layer interconnect 112 formed on an insulating film 111 that is upon a silicon substrate not shown in the drawings with the conventional via-first method.

Figure 1B:
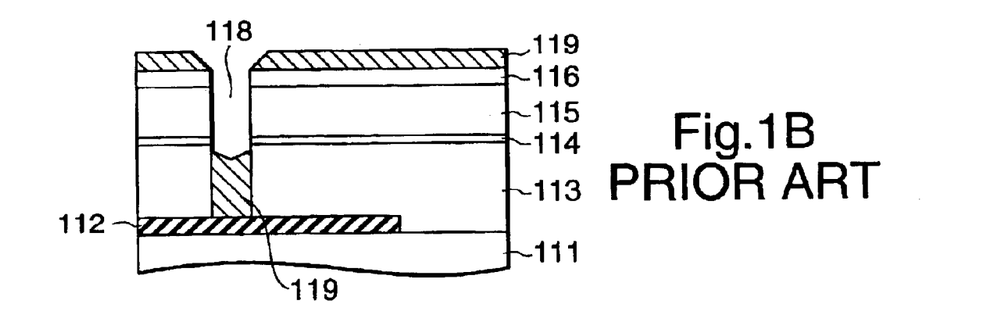
Figure 1C:
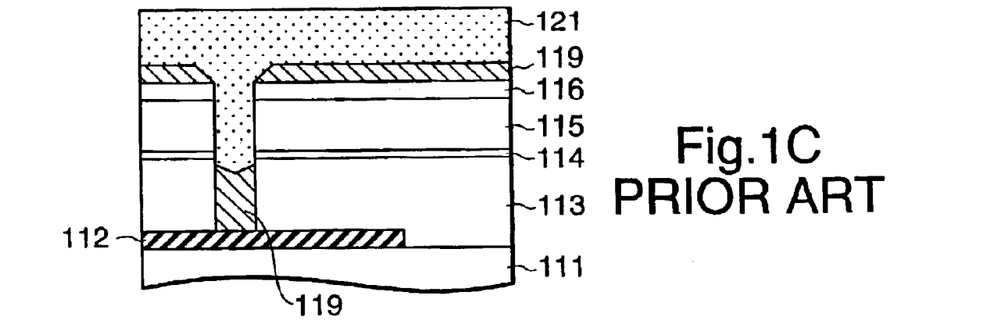
Figure 1D:
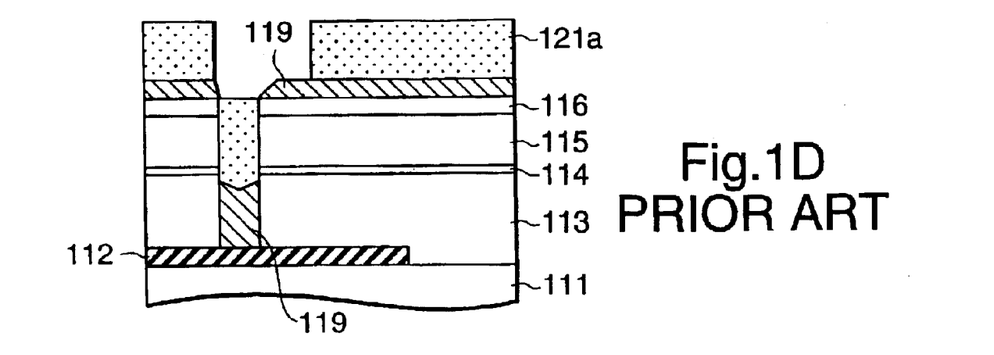

A via hole 118, which reaches the lower layer interconnect 112, is then opened in the interlayer insulating film 117 with photolithography techniques utilizing a photoresist not shown in the drawings. Next, as illustrated in FIG. 1B, an anti-reflective coating 119 is applied across the entire interlayer insulating film 117 and baked to harden, whereby the anti-reflective coating 119 is embedded in the via hole 118 up to nearly half its depth with the conventional via-first method. Subsequently, as illustrated in FIG. 1C, a chemically amplified positive type resist 121 for patterning is applied. Next, as illustrated in FIG. 1D, the positive type resist 121 is exposed into a predetermined pattern and developed so as to form an interconnective trench resist pattern 121a. Following as in FIG. 2A, an interconnective trench 122 is formed by etching the low-permittivity film 115 and silicon dioxide film 116 upon the etch stop film 114 using the interconnective trench resist pattern 121a.

Figure 2A:
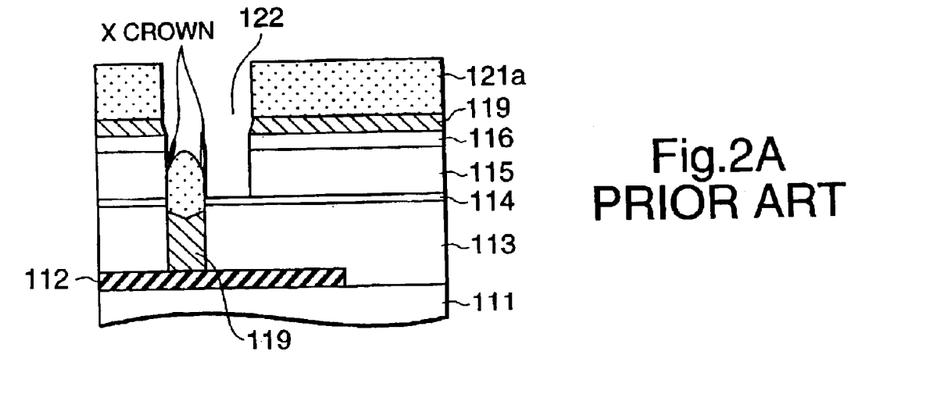
FIG. 2A through FIG. 2C depict cross sections continuing after FIG. 1D to illustrate the conventional example of the pattern formation process in order of steps thereof.
Figure 2B:
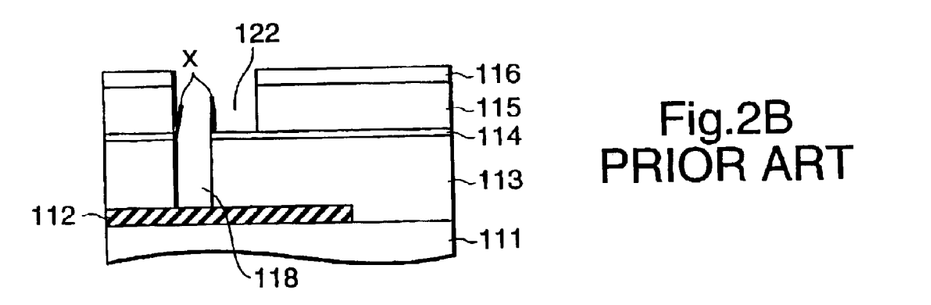
Figure 2C:
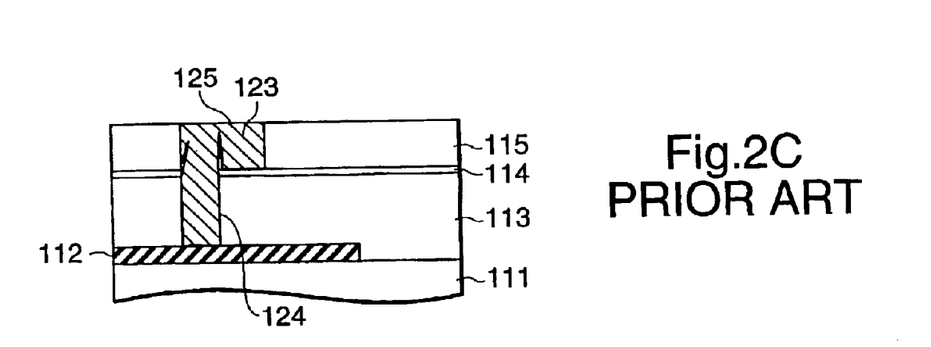

Thereafter, upon removal of the anti-reflective coating 119 within the via hole 118 and on the interlayer insulating film 117 as illustrated in FIG. 2B, the silicon dioxide film 116 is etched and removed as in FIG. 2C. Subsequently, a metallic material 123 is embedded in the interconnective trench 122 and via hole 118, and only the metallic material 123 is left therein using chemical mechanical polishing (CMP). The dual damascene structure that is configured from a via 124 and a trench interconnect (upper layer interconnect) 125 is then completed.

However, the following problems arise with the conventional via-first method. Namely, when forming the interconnective trench resist pattern 121a by subjecting the positive type resist 121 to an exposure and a development process as indicated in the procedure of FIG. 1D, development using a developing fluid for the positive type resist 121 that is applied in the deep via hole 118 is not adequately performed, whereby a portion of the resist 121 remains in the via hole 118.

Consequently, forming the interconnective trench 122 by etching the low-permittivity film 115 and silicon dioxide film 116 under these conditions causes etch residue X that is called a crown to generate in the interconnective trench 122 along the remaining resist 121 as in FIG. 2A. This etch residue X cannot be easily eliminated by an organic stripping solution.

Consequently, as in FIG. 2B and FIG. 2C, the metallic material 123 is embedded in the interconnective trench 122 and via hole 118 thereafter, and moreover, the etch residue X remains until the via 124 and trench interconnect 125 are formed. As a result, electrically discontinuous portions or highly electrical highly resistant portions generate between the via 124 and trench interconnect 125, and decline in interconnect yield and reliability occurs.

As causes for such crown generation, the following two points can be given. First, since the vial hole is considerably deep, the resist that has penetrated into the via hole is exposed in a nearly 1 mm defocused state when forming the resist pattern of the interconnect trench through exposure. Accordingly, optical power in this area is extremely low, and a high rate of solution can no longer be obtained during development. As a result, resist remains within the via hole.

Second, density of the low-permittivity interlayer insulating film that is used in multilayered interconnections is typically low, and large amounts of moisture and basic impurities are included in the inner portions thereof. Since they diffuse from the via hole into the resist, a chemically amplified reaction is inhibited. Accordingly, the rate of solution of the resist within the via hole further decreases, and residual resist called poisoning and/or poor resolution occur.

Consequently, according to examination by the inventor, with the dual damascene process of the via-first method, the resist left in the via hole must be eliminated. The via-first method in such light is disclosed in Japanese Patent Application Laid-Open No. 2000-195955 (Reference 1).

In Reference 1, material including a thermally cross-linked compound is proposed as the embedding material for filling in the via hole, whereat the given example uses an alkali soluble resin and positive type resist composite as comparative examples. Since these are embedded in a different procedure than that of the resist used for forming the resist pattern for the interconnect trench, a portion of that resist penetrating into the via hole and remaining therein due to development when forming that resist pattern is unavoidable.

SUMMARY OF THE INVENTION

The object of the present invention is to inhibit residual resist in the via hole; and to provide a pattern formation method, which can manufacture a highly reliable dual damascene structure.

A method of fabricating patterns with a dual damascene process of the present invention, including the steps of: opening a via hole in an interlayer insulating film, which covers a lower conductive layer, so as to expose part of the lower conductive layer; embedding a protective film on the base portion of the via hole; embedding a soluble resin, which dissolves in a resist developing fluid under unexposed conditions upon the protective film in the via hole; forming a resist pattern, which has an aperture window in a region including the via hole, by applying a photoresist upon the interlayer insulating film, and subjecting this photoresist to an exposure and a development process; forming an interconnective trench in the surface of the interlayer insulating film utilizing the resist pattern; removing the protective film; and forming a dual damascene structure by embedding a metallic material into the vial hole and interconnective trench.

According to the present invention, by pre-embedding the soluble resin into the via hole, the interconnect trench photoresist will not be filled into the via hole, nor will the resist be left within the via hole when developing the photoresist; furthermore, since the soluble resin within the via hole is dissolved and removed by being subjected to a development process easier than the resist, the resist and resin remaining in the via hole can ultimately be avoided. Accordingly, a highly reliable dual damascene structure may be realized without generation of a crown, which is caused by resist remaining in the via hole.

DETAILED DESCRIPTION OF THE PREFERRED EMBODIMENTS

Hereinafter, several embodiments of a pattern formation method of the dual damascene process of the present invention will be given and described in detail with reference to the drawings.

Figure 3:
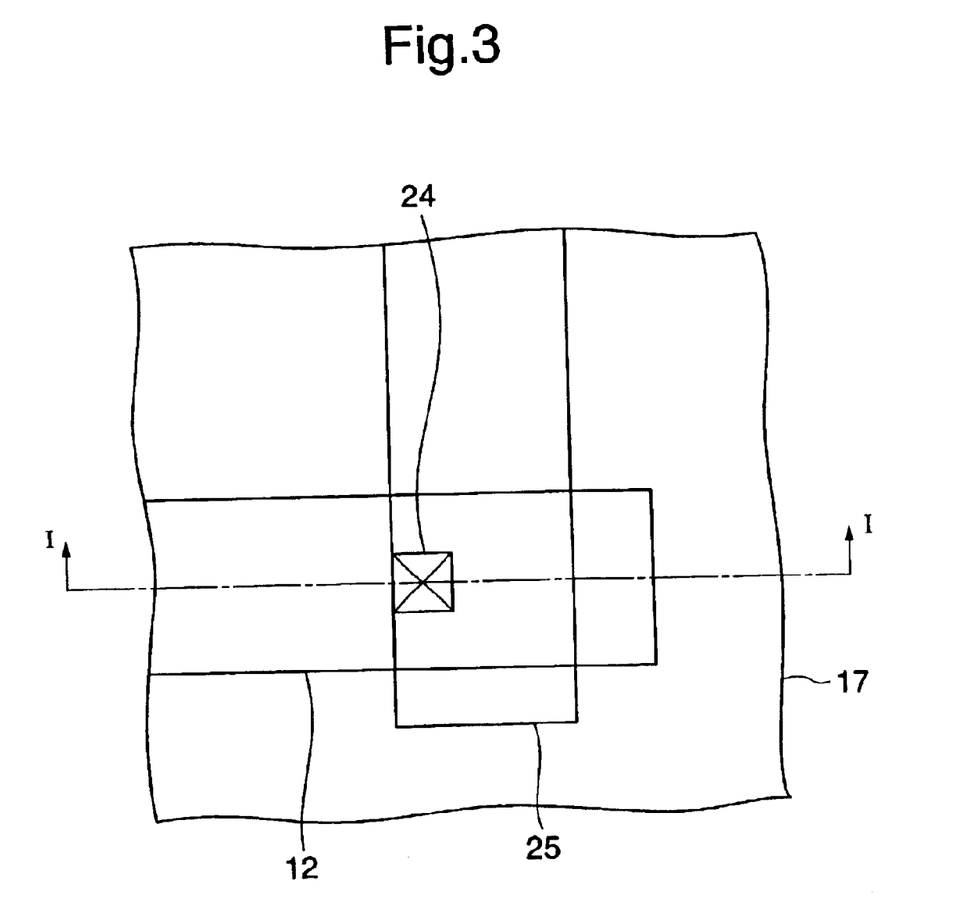
FIG. 3 depicts a top view of a dual damascene structure of a first embodiment of the present invention.

FIG. 3 depicts a top view of a dual damascene pattern formed according to the first embodiment of the pattern formation method of the present invention. As illustrated in FIG. 3, a lower layer interconnect 12 of a dual damascene, which applies the first embodiment of the pattern formation method of the present invention, is formed into a predetermined pattern, and upon an interlayer insulating film 17 that covers this lower layer interconnect 12, a trench interconnect, which has a predetermined pattern partially crossing the lower layer interconnect 12, is formed as an upper interconnect 25.

At the crossing portions of the dual damascene, a via 24 is then extended downwards from the upper interconnect 25, and upon contact with the lower layer interconnect 12, the lower layer interconnect 12 and upper interconnect 25 are electrically connected through the via.

FIG. 4A through FIG. 4C, FIG. 5A through FIG. 5C, and FIG. 6A through FIG. 6C depict cross sections illustrating a pattern formation process of the first embodiment in the order of steps thereof, and depicts the section cut along the line I—I in FIG. 3. To begin with, with the dual damascene that utilizes the first embodiment of the pattern formation method of the present invention, as in FIG. 4A, a silicon dioxide film 13 is formed as a lower interlayer insulating film with a predetermined thickness such as to cover the lower layer interconnect 12, which is formed on an insulating film 11 that is upon the surface of a semiconductor substrate not shown in the drawings. A silicon carbide film 14 is thinly formed thereupon as an etch stop film. Moreover, a low-permittivity film 15 and silicon dioxide film 16 are layered thereupon as upper interlayer insulating films with predetermined thicknesses, forming an interlayer insulating film 17 made from these stacked interlayer insulating films.

Figure 4A:
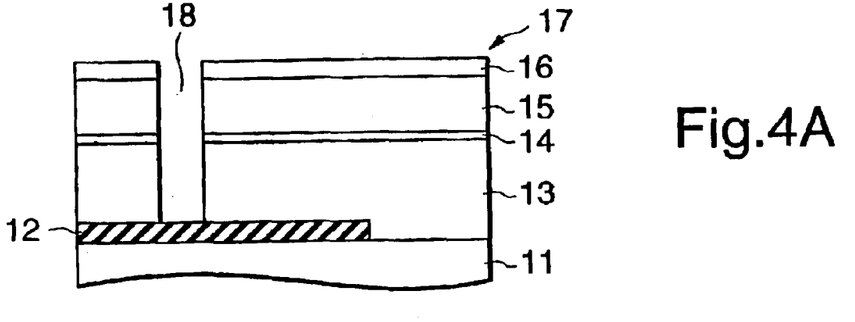
FIG. 4A through FIG. 4C depict cross sections illustrating a pattern formation process of the dual damascene structure of the first embodiment of the present invention in order of steps thereof.

A resist pattern, which is opened in an area where the via is to be formed, is then formed by applying and subjecting to an exposure and a development process an anti-reflective coating and photoresist, which do not appear in the drawings, upon the interlayer insulating film 17, and by using this resist pattern as a mask, the upper interlayer insulating films 15 and 16, etch stop film 14 and lower interlayer insulating film 13 are successively etched so as to open a via hole 18. Depth of a typical via hole is around 0.5 to 1.5 mm.

Figure 4B:
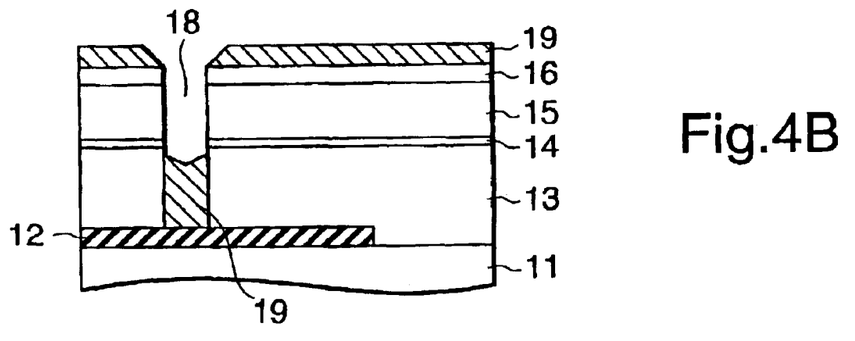
Figure 4C:
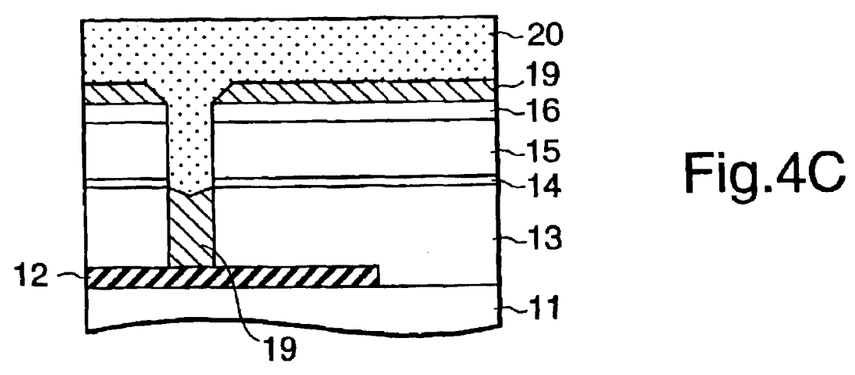

Subsequently, after removing the photoresist and anti-reflective coating, an anti-reflective coating 19 is newly applied over the entire surface as in FIG. 4B, and by baking and hardening thereof, the hardened anti-reflective coating 19 is embedded up to approximately halfway of the via hole 18. Afterwards, as in FIG. 4C, a chemically amplified positive type resist 20 with a protective ratio of 0, namely an organic solvent with a polyhydroxystyrene resin dissolved therein is thickly applied as a developable resin (hereinafter, soluble resin) from above the anti-reflective coating 19 using a photoresist developing fluid even if unexposed.

This soluble resin 20 is filled into the via hole 18, forming a sufficient film thickness so as to completely fill in the via hole 18. On that basis, as in FIG. 5A, the soluble resin 20 that is above the anti-reflective coating 19 is completely removed by etching back, leaving only the soluble resin 20 within the via hole 18.

Figure 5A:
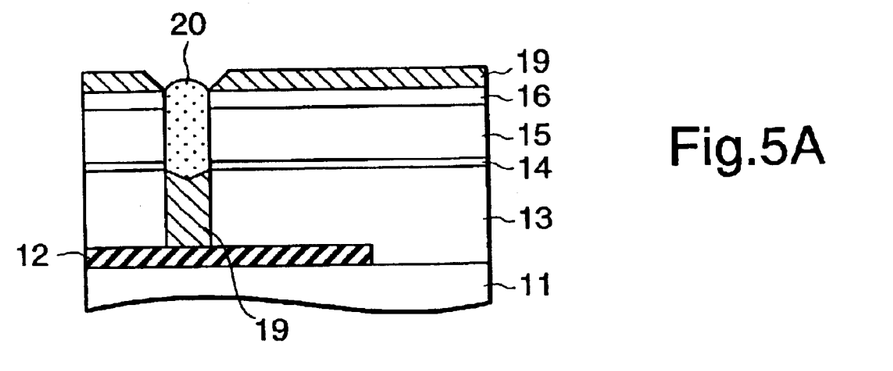
FIG. 5A through FIG. 5C depict cross sections continuing after FIG. 4C to illustrate the pattern formation process of the dual damascene structure of the first embodiment of the present invention in order of steps thereof.
Figure 5B:
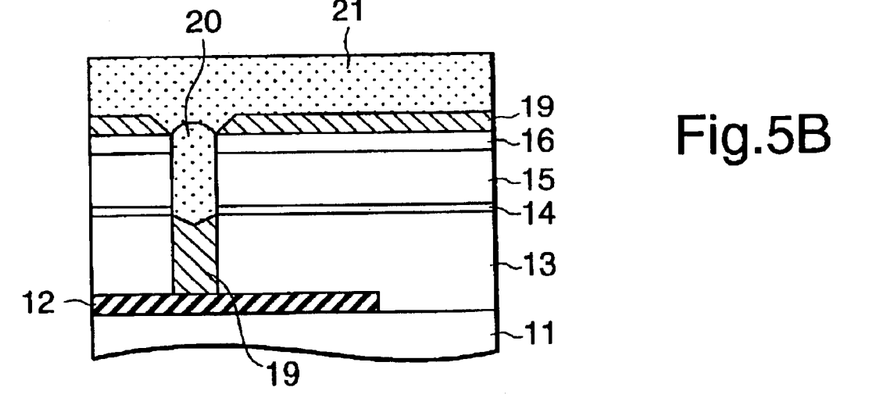

Next, with the dual damascene that utilizes the first embodiment of the pattern formation method of the present invention, as in FIG. 5B, a chemically amplified positive type resist 21 for patterning, namely the well known photoresist is applied. An exposure and a development process are then executed to form an interconnect trench pattern for the photoresist 21.

Figure 5C:
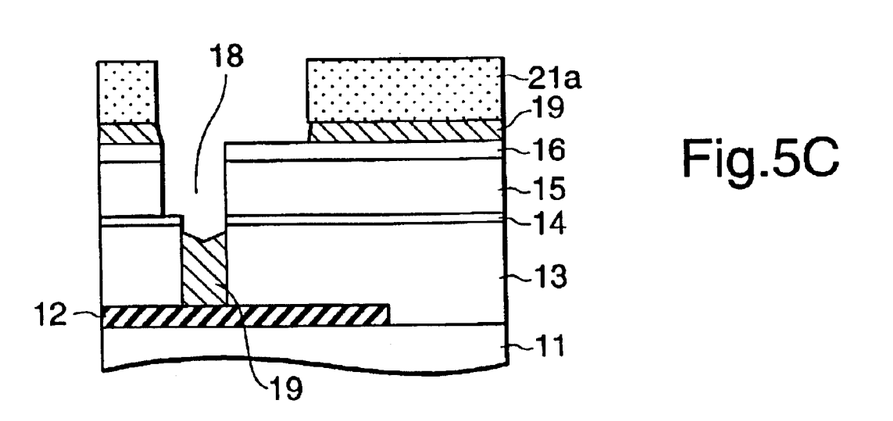

Accordingly, as in FIG. 5C, an interconnect trench resist pattern 21a is formed. At the same time, in an aperture of this interconnect trench resist pattern 21a, the soluble resin 20 that is embedded in the via hole 18 is developed, namely dissolved and removed using a resist developing fluid. Following as in FIG. 6A, using the interconnective trench resist pattern 21a as a mask, the upper interlayer insulating films 15 and 16 are etched utilizing the low-permittivity film 14 so as to form an interconnective trench 22. Within the via hole 18 at this time, the lower layer interconnect 12 is protected from being etched by the anti-reflective coating 19 embedded in the base portion.

Figure 6A:
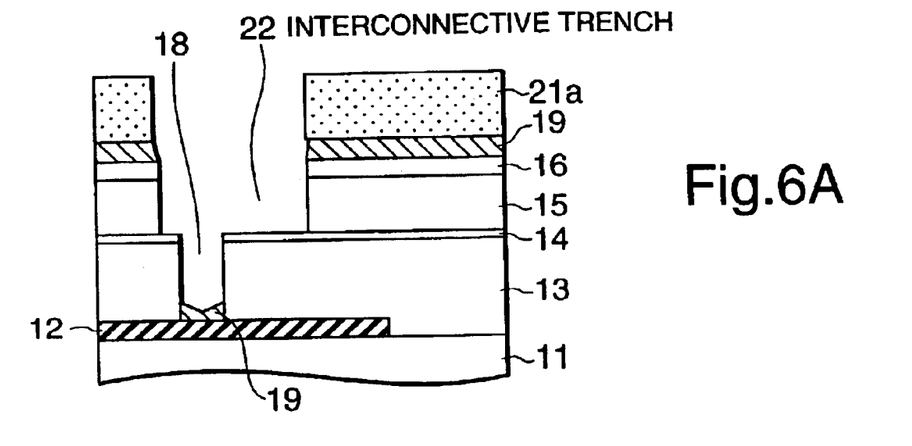
FIG. 6A through FIG. 6C depict cross sections continuing after FIG. 5C to illustrate the pattern formation process of the dual damascene structure of the first embodiment of the present invention in order of steps thereof.
Figure 6B:
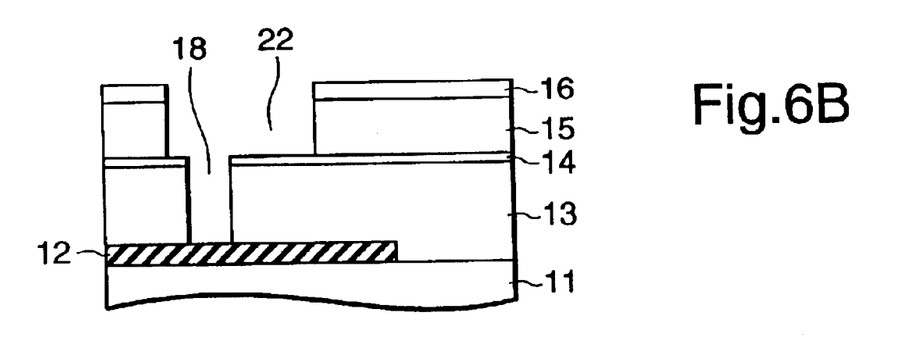
Figure 6C:
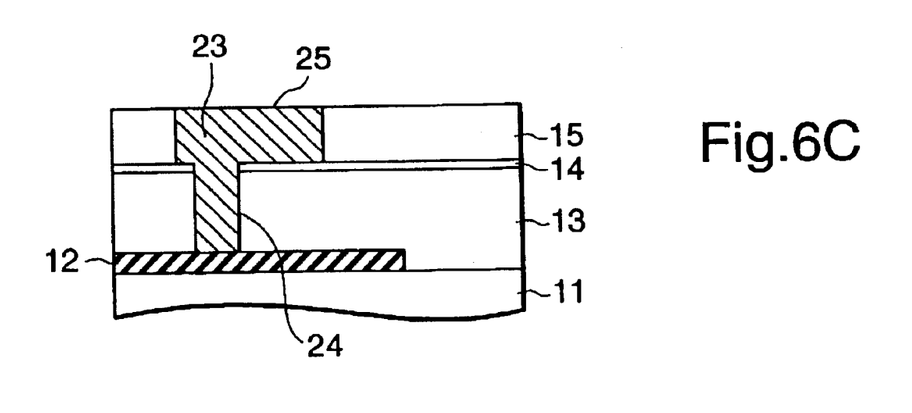

Moreover, as in FIG. 6B, the interconnective trench resist pattern 21a is stripped and the anti-reflective coating 19 is stripped. At this time, the anti-reflective coating 19 is also eliminated from within the via hole 18. On that basis, as in FIG. 6C, after etching to remove the silicon dioxide film 16 from among the upper interlayer insulating films, a metallic material 23 is embedded in a region that includes the via hole 18 and interconnect trench 22, and by eliminating the metallic material that is on the interlayer insulating film 17 using CMP, only the metallic material 23 remains within the via hole 18 and interconnect trench 22, whereby a dual damascene structure configured from the via 24 and upper layer interconnect 25 is manufactured.

As described above, in the manufacturing process for the dual damascene structure, by pre-embedding the soluble resin 20 into the via hole 18, the interconnect trench photoresist 21 will not be filled into the via hole 18. Thus, the resist 21 is not left within the via hole 18 when developing the resist 21. At the same time, since the soluble resin 20 within the via hole 18 is dissolved and removed by being subjected to a development process easier than the resist 21, the resist 21 remaining in the via hole can ultimately be avoided.

Accordingly, a favorable dual damascene structure may be realized without generation of a crown, which is caused by resist remaining in the via hole 18. Furthermore, mixing of the photoresist and soluble resin in the inner portion of the deep via hole is unlikely to occur. Assuming that it does occur, the percentage of the soluble resin in this case is overwhelmingly larger. Accordingly, even if optical power becomes extremely low due to defocus and the like when subjecting the photoresist to an exposure process, and even if the basic impurities that inhibit the chemically amplified reaction from within the interlayer insulating film have been diffused, a sufficiently high rate of solution can be obtained within the via hole. Therefore, photoresist and soluble resin remaining in the via hole is reliably prevented.

FIG. 7A through FIG. 7C and FIG. 8A through FIG. 8C depict cross sections illustrating the second embodiment of the present invention in the order of steps thereof, illustrating the same area as in the first embodiment. Furthermore, the same reference numerals are attached to equivalent portions as with the first embodiment.

Figure 7A:
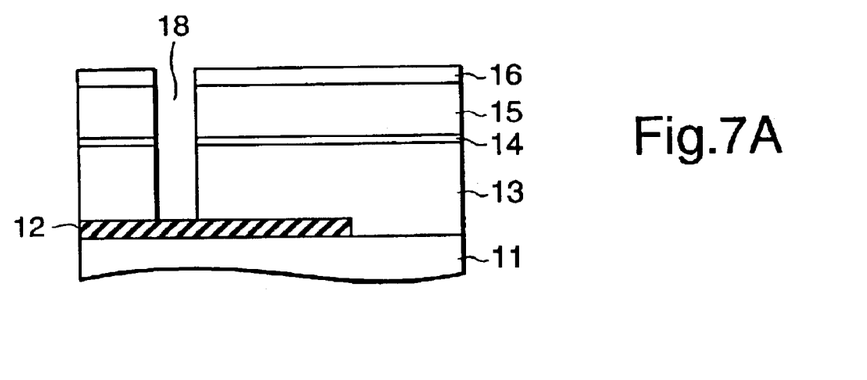
FIG. 7A through FIG. 7C depict cross sections illustrating a pattern formation process of a dual damascene structure of a second embodiment of the present invention in order of steps thereof.

To begin with, with the dual damascene that utilizes the second embodiment of the pattern formation method of the present invention, as in FIG. 7A, a silicon dioxide film 13 is formed as a lower interlayer insulating film with a predetermined thickness such as to cover the lower layer interconnect 12, which is formed on an insulating film 11 that is upon the surface of a semiconductor substrate not shown in the drawings. A silicon carbide film 14 is then thinly formed thereupon as an etch stop film. A low-permittivity film 15 and silicon dioxide film 16 are further layered thereupon as upper interlayer insulating films with predetermined thicknesses, forming an interlayer insulating film 17 made from these stacked interlayer insulating films. A resist pattern that does not appear in the drawings as in the first embodiment is then formed upon the interlayer insulating film 17, and using this resist pattern as a mask the upper interlayer insulating films 15 and 16, etch stop film 14 and lower interlayer insulating film 13 are successively etched so as to open a via hole 18.

Figure 7B:
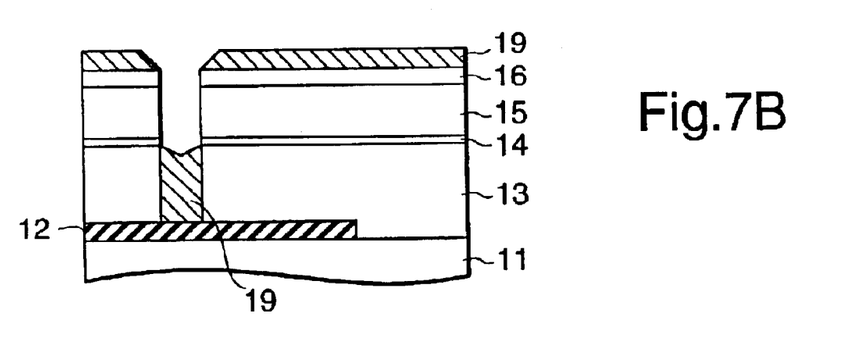

Subsequently, with the dual damascene that utilizes the second embodiment of the pattern formation method of the present invention, after removing the photoresist and anti-reflective coating, an anti-reflective coating 19 is newly applied over the entire surface as in FIG. 7B, and by baking and hardening thereof, the hardened anti-reflective coating 19 is embedded up to approximately halfway of the via hole 18.

Figure 7C:
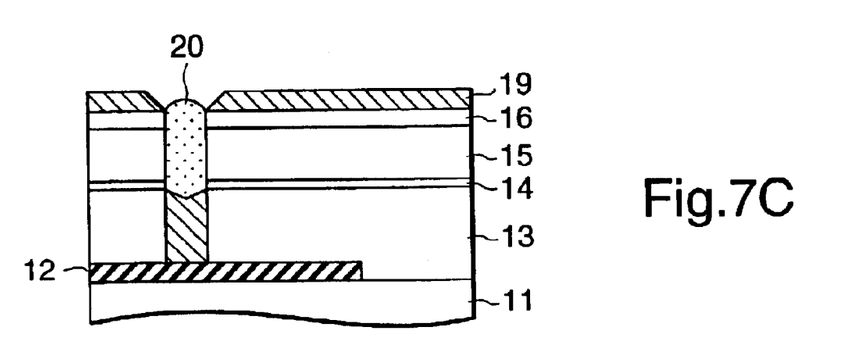

Afterwards, as in FIG. 7C, a chemically amplified positive type resist 21, which has a protection ratio enabling to obtain a rate of solution greater than 20 nm/S, is applied as a soluble resin from above the anti-reflective coating 19 so as to fill up to approximately 90% deep of the via hole 18 even if unexposed.

Figure 8A:
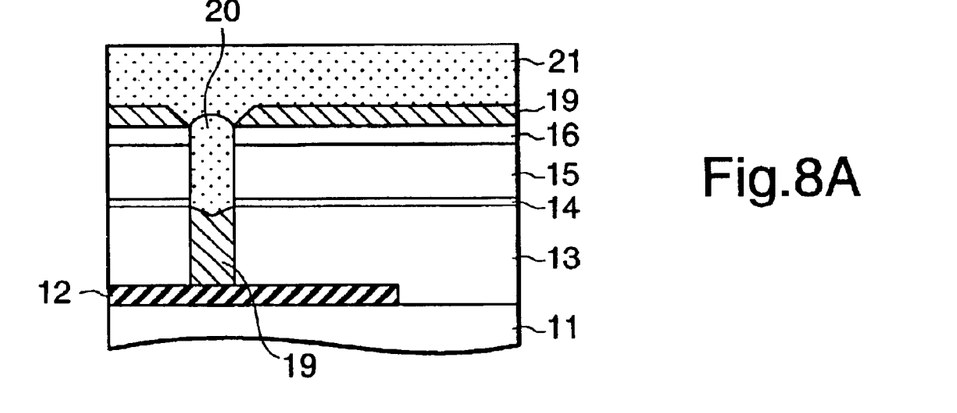
FIG. 8A through FIG. 8C depict cross sections continuing after FIG. 7C to illustrate the pattern formation process of the dual damascene structure of the second embodiment of the present invention in order of steps thereof.
Figure 8B:
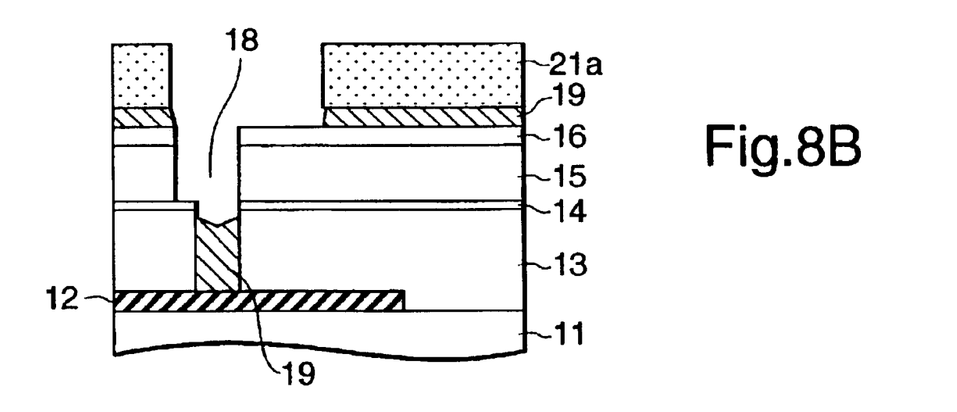

Subsequently, as in FIG. 8A, a chemically amplified positive type resist 21 for patterning, namely the well known photoresist is applied. At this time, since the photoresist 21 is applied up to approximately 10% the depth from the top surface side of the via hole 18, embedding a thin coat of a low-viscosity resist may be relatively easy. An exposure and a development process are then executed to form an interconnect trench pattern for the photoresist 21. Accordingly, as in FIG. 8B, simultaneously to forming an interconnect trench resist pattern 21a, in an aperture thereof, the photoresist 21 that is embedded in the via hole 18 and the soluble resin 20 therebeneath are developed, namely dissolved and removed using a resist developing fluid.

Figure 8C:
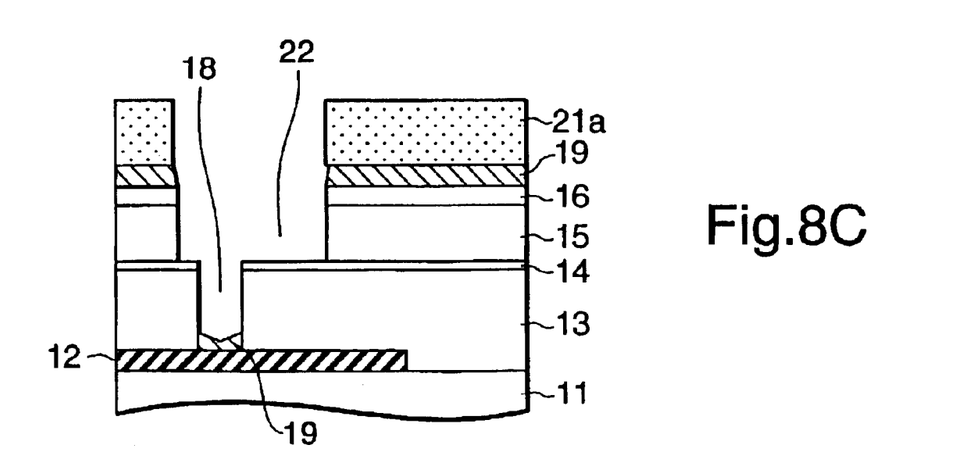

Following as in FIG. 8C, using the interconnective trench resist pattern 21a as a mask, the upper interlayer insulating films 15 and 16 are etched utilizing the low-permittivity film 14 so as to form an interconnective trench 22. Within the via hole 18 at this time, the lower layer interconnect 12 is protected from being etched by the anti-reflective coating 19 embedded in the base portion.

Moreover, with the dual damascene that utilizes the second embodiment of the pattern formation method of the present invention, the interconnective trench resist pattern is stripped, and the anti-reflective coating is successively stripped. Thereafter, the anti-reflective coating 19 on the interlayer insulating film 17 and in the via hole 18 is etched and removed. On that basis, as respectively illustrated in FIG. 6B and FIG. 6C, a metallic material is embedded in a region that includes the via hole 18 and interconnect trench 22, and by eliminating the metallic material that is on the interlayer insulating film using CMP, only the metallic material is left in the via hole and interconnect trench, whereby a dual damascene structure configured from the via and upper layer interconnect (trench interconnect) is manufactured.

As described above, by pre-embedding the soluble resin 20 up to a level 90% deep of the via hole 18, the interconnect trench photoresist 21 is only filled up to approximately 10% the depth from the top surface side of the via hole 18. Thus, the resist 21 within the via hole 18 is reliably eliminated when developing the resist 21, and at the same time, since the soluble resin 20 within the via hole 18 is also dissolved and removed, the resist and the like remaining within the via hole 18 can ultimately be avoided.

Accordingly, a favorable dual damascene structure may also be realized without generation of a crown, which is caused by resist remaining in the via hole 18.

Furthermore, mixing of the photoresist and soluble resin in the inner portion of the deep via hole is unlikely to occur. Assuming that it does occur, the percentage of the soluble resin in this case is overwhelmingly larger. Accordingly, even if optical power becomes extremely low due to defocus and the like when subjecting the photoresist to an exposure process, and furthermore, even if the basic impurities that inhibit the chemically amplified reaction from the interlayer insulating film have been diffused, a sufficiently high rate of solution can be obtained within the via hole, and photoresist and soluble resin remaining in the via hole is reliably prevented.

It should be noted that with the first and second embodiments, in the case of embedding a soluble resin into a via hole, the soluble resin flows into the via hole while baking prior to exposure (pre-bake), whereby the amount of the soluble resin remaining upon the surface of the interlayer insulating film is sufficiently small. Accordingly, should mixing with the patterning resist occur on the surface of the interlayer insulating film, resolution quality is barely affected.

Here, soluble resin is used with each embodiment, however, using a water-based resin such as polyvinyl alcohol instead of the soluble resin also achieves the same results.

As described above, the present invention, through pre-embedding a soluble resin into a via hole, hardly any interconnect trench resist is filled into the via hole, thus the resist does not remain within the via hole when developing thereof.

Furthermore, since the soluble resin within the via hole is dissolved and removed easier than the resist 21, the resist remaining within the via hole can ultimately be avoided. Accordingly, a highly reliable dual damascene structure may be realized without generation of a crown, which is caused by resist remaining in the via hole. Furthermore, mixing of the photoresist and soluble resin in the inner portion of the deep via hole is unlikely to occur. Assuming that it does occur, the percentage of the soluble resin in this case is overwhelmingly larger. Accordingly, even if optical power becomes extremely low due to defocus and the like when subjecting the photoresist to an exposure process, and even if the basic impurities that inhibit the chemically amplified reaction from the interlayer insulating film have been diffused, a sufficiently high rate of solution can be obtained within the via hole. Photoresist and soluble resin remaining in the via hole is also reliably prevented.

What is claimed is:

1. A method of fabricating patterns with dual damascene process, comprising the steps of:
    opening a via hole in an interlayer insulating film, which covers a lower conductive layer, so as to expose part of the lower conductive layer;
    embedding a protective film on the base portion of the via hole;
    embedding a soluble resin, which dissolves resist developing fluid under unexposed conditions, upon protective film in the via hole;
    forming a resist pattern, which has an aperture window in a region including the via hole, by applying a photoresist upon the interlayer insulating film, and subjecting this photoresist an exposure and a development process;
    forming an interconnective trench in the surface of interlayer insulating film utilizing the resist pattern;
    removing the protective film; and forming a dual damascene structure by embedding a metallic material into the vial via hole and interconnective trench.

2. The method of fabricating patterns with a dual damascene process, according to claim 1, wherein the soluble resin is a resin with a protection ration of 0, which dissolves in a resist developing fluid under unexposed conditions.

3. The method of fabricating patterns with a dual damascene process, according to claim 2, wherein the soluble resin is applied with a thickness that completely fills in the via hole, and then subjected to an etch back process so as to fill in the via hole.

4. The method of fabricating patterns with a dual damascene process, according to claim 2, wherein the soluble resin is applied with a thickness filling in up to approximately 90% the depth of the via hole.

5. The method of fabricating patterns with a dual damascene process, according to claim 1, wherein the soluble resin is a resin with a rate of solution greater than 20 nm/S, which dissolves in a resist developing fluid under unexposed conditions.

6. The method of fabricating patterns with a dual damascene process, according to claim 5, wherein the soluble resin is applied with a thickness that completely fills in the via hole, and then subjected to an etch back process so as to fill in the via hole.

7. The method of fabricating patterns with a dual damascene process, according to claim 5, wherein the soluble resin is applied with a thickness filling in up to approximately 90% the depth of the via hole.

8. The method of fabricating patterns with a dual damascene process, according to claim 1, wherein a water-based resin is used instead of the soluble resin.

9. The method of fabricating patterns with a dual damascene process, according to claim 8, wherein the soluble resin is applied with a thickness that completely fills in the via hole, and then subjected to an etch back process so as to fill in the via hole.

10. The method of fabricating patterns with a dual damascene process, according to claim 8, wherein the soluble resin is applied with a thickness filling in up to approximately 90% the depth of the via hole.

11. The method of fabricating patterns with a dual damascene process, according to claim 1, wherein the water-based resin is polyvinyl alcohol.

12. The method of fabricating patterns with a dual damascene process, according to claim 1, wherein the soluble resin is applied with a thickness that completely fills in the via hole, and then is subjected to an etch back process so as to fill in the via hole.

13. The method of fabricating patterns with a dual damascene process, according to claim 1, wherein the soluble resin is applied with a thickness filling in up to approximately 90% the depth of the via hole.

* * * * *